(12) United States Patent
Takanashi

(10) Patent No.: US 8,414,701 B2
(45) Date of Patent: Apr. 9, 2013

(54) METHOD FOR MANUFACTURING SILICON SINGLE CRYSTAL IN WHICH A CRYSTALLIZATION TEMPERATURE GRADIENT IS CONTROLLED

(75) Inventor: Keiichi Takanashi, Tokyo (JP)

(73) Assignee: Sumco Corporation, Tokyo (JP)

( * ) Notice: Subject to any disclaimer, the term of this patent is extended or adjusted under 35 U.S.C. 154(b) by 471 days.

(21) Appl. No.: 12/683,515

(22) Filed: Jan. 7, 2010

(65) Prior Publication Data
US 2010/0175611 A1 Jul. 15, 2010

(30) Foreign Application Priority Data

Jan. 13, 2009 (JP) ................................. 2009-005002

(51) Int. Cl.
*C30B 15/26* (2006.01)

(52) U.S. Cl. ................ 117/15; 117/13; 117/14; 117/19; 117/20; 117/21; 117/30; 117/32; 117/33; 117/34; 117/200; 117/203; 117/206; 117/208; 117/217; 117/218

(58) Field of Classification Search ............. 117/13–15, 117/19–21, 30, 32–34, 200–203, 206, 208, 117/217–218, 931–932
See application file for complete search history.

(56) References Cited

U.S. PATENT DOCUMENTS

| | | | |
|---|---|---|---|
| 5,653,799 A * | 8/1997 | Fuerhoff | 117/14 |
| 6,066,306 A | 5/2000 | Iida et al. | |
| 6,120,599 A | 9/2000 | Iida et al. | |
| 6,203,611 B1 * | 3/2001 | Kimbel et al. | 117/15 |
| 7,172,656 B2 | 2/2007 | Takanashi et al. | |
| 7,323,048 B2 | 1/2008 | Sakurada et al. | |
| 2006/0130740 A1 * | 6/2006 | Sakurada | 117/20 |
| 2007/0151505 A1 * | 7/2007 | Cho | 117/13 |
| 2009/0064923 A1 | 3/2009 | Takanashi | |
| 2009/0293801 A1 | 12/2009 | Kuragaki | |
| 2010/0006022 A1 | 1/2010 | Kishi et al. | |

FOREIGN PATENT DOCUMENTS

| | | |
|---|---|---|
| JP | 11-147786 | 6/1999 |
| JP | 2001-019588 | 1/2001 |
| JP | 2001-342097 | 12/2001 |
| JP | 2004-331437 | 11/2004 |

(Continued)

OTHER PUBLICATIONS

IBM Technical Disclosure Bulletin, vol. 24, Issue 11B, pp. 6038-6039, published Apr. 1982, entitled "Technique for monitoring diameter variation in Czochralski crystal growth."*

(Continued)

*Primary Examiner* — Robert M Kunemund
*Assistant Examiner* — Kenneth A Bratland, Jr.
(74) *Attorney, Agent, or Firm* — Greenblum & Bernstein, P.L.C.

(57) ABSTRACT

In this method for manufacturing a silicon single crystal, when growing the silicon single crystal, in order to control the V/G value with high accuracy so as to yield a desired defect-free region, it is important to conduct the pulling at a constant pulling rate. In the method for pulling a silicon single crystal in the present invention, in order to control the V/G value with high accuracy, the distance Δt between the melt surface of the silicon melt and the heat shielding member that is disposed so as to oppose to and to partially cover this melt surface is continuously measured while pulling (growing) the silicon single crystal.

4 Claims, 4 Drawing Sheets

FOREIGN PATENT DOCUMENTS

| | | |
|---|---|---|
| JP | 2005-015313 | 1/2005 |
| JP | 2005-187291 | 7/2005 |
| JP | 2008-189485 | 8/2008 |
| KR | 10-2006-0093645 | 8/2006 |
| KR | 10-2008-0110865 | 12/2008 |

OTHER PUBLICATIONS

Japan Office action, dated Sep. 18, 2012 along with an English translation thereof.

* cited by examiner

METHOD FOR MANUFACTURING SILICON SINGLE CRYSTAL IN WHICH A CRYSTALLIZATION TEMPERATURE GRADIENT IS CONTROLLED

BACKGROUND OF THE INVENTION

1. Field of the Invention

The present invention relates to a method for manufacturing a silicon single crystal which is capable of yielding a high quality silicon single crystal having desired crystal characteristics by accurately controlling the diameter of a silicon single crystal when pulling upward the silicon single crystal from a silicon melt using the Czochralski method.

Priority is claimed on Japanese Patent Application No. 2009-005002, filed Jan. 13, 2009, the content of which is incorporated herein by reference.

2. Description of Related Art

Conventionally, various methods have been available for manufacturing silicon single crystals, and the Czochralski method (hereafter, simply referred to as the "CZ method") being the most representative among them. In the CZ method of growing a silicon single crystal, polysilicon is melted in a crucible to form a silicon melt. Subsequently, a seed crystal is dipped into the silicon melt, and the seed crystal is then pulled upward at a predetermined rotational speed and a predetermined pulling rate, thereby growing a cylindrical silicon single crystal below the seed crystal.

In this process of pulling a silicon single crystal upward, it is necessary to maintain a positional relationship between a heater for heating the crucible and the level of the silicon melt surface so that the amount of heat received by the silicon melt is maintained at a constant level. For this reason, the position at which a crucible is held is moved upward by a vertically moving apparatus, thereby keeping the level of the silicon melt surface, which goes down as the silicon single crystal is pulled upward, at the same position (i.e., the same height) with respect to that of the heater.

FIG. 6 is a diagram for explaining a state of defect distribution in the cross section of a silicon single crystal which is grown while gradually lowering the pulling rate in the step for pulling the silicon single crystal. As shown in FIG. 6, ring-like oxidation induced stacking faults (R-OSFs) appear on the longitudinal section of a silicon single crystal which is grown while gradually lowering the pulling rate. Different types of grown-in defects are observed following the crystal growth in a crystal region in which the silicon single crystal is pulled at a higher rate than that for the OSF-generating region where R-OSFs appear, and a crystal region in which the silicon single crystal is pulled upward at a lower rate than that for the OSF-generating region. The crystal region, which is formed at higher pulling rates than the pulling rate at which the R-OSFs develop, is formed as an infrared scattering defect generating region in which void defects (vacancy type defects) also known as crystal originated particles (COPs) or flow pattern defects (FPDs) are detected.

In addition, in a crystal region which is formed at lower pulling rates than that for forming the OSF-generating region and is located adjacent to the OSF-generating region, an oxygen precipitation promoting region (PV region) in which oxygen precipitates (i.e., bulk micro defects: BMDs) can be formed is present. In a crystal region which is formed at even lower pulling rates than that for forming the oxygen precipitation promoting region, an oxygen precipitation inhibiting region (PI region) in which no oxygen precipitates are formed is present. Both the oxygen precipitation promoting region (PV region) and the oxygen precipitation inhibiting region (PI region) are formed as defect-free regions which are regions having extremely few grown-in defects (i.e., a region sandwiched between the dotted lines A and B in FIG. 6). Moreover, in a crystal region which is formed at even lower pulling rates than that for forming this defect-free region, a dislocation cluster generating region is present, in which the aggregation of interstitial Si involving dislocation is formed so that interstitial Si defects (dislocation cluster defects) are detected.

Void defects within the silicon single crystal may act as a factor for deteriorating the gate oxide integrity at an early stage of the wafer production. Moreover, the interstitial Si defects within the silicon single crystal also deteriorate the device characteristics. Accordingly, for the sake of quality characteristics of silicon single crystals, growth of crystals within a defect-free region is desired.

The extent of these grown-in defects introduced is thought to be determined based on the V/G ($mm^2/°$ C.·min) value; i.e., a ratio between the pulling rate V (mm/min) when growing a silicon single crystal and the crystallization temperature gradient G (° C./mm) in the vicinity of solid-liquid interface in the pull axis direction. That is, by growing a silicon single crystal while controlling the V/G value at a constant level of a predetermined value, it becomes possible to manufacture a silicon single crystal having a desired defect state or a desired defect-free region.

In general, the V/G value is controlled by adjusting the pulling rate V. Moreover, when controlling the V/G value, it has been known that the crystallization temperature gradient G at the time of pulling silicon single crystal is greatly affected by the distance (spacing) between the melt surface of the silicon melt and a heat shielding member disposed so as to oppose the melt surface. In order to control the V/G value with high accuracy so as to attain a desired defect-free region, it is required to keep this distance between the melt surface and the heat shielding member at a constant level. However, as the pulling of silicon single crystal proceeds, the amount of silicon melt decreases and the level of the melt surface declines. Therefore, the level of the crucible needs to be raised.

Conventionally, the volume of silicon melt decreased in accordance with the pulling of a silicon single crystal is first calculated, and the degree of increase in the level of a crucible is then calculated based on the decreased volume of silicon melt and the inner diameter of the crucible. However, it is difficult to accurately calculate the decreased amount of silicon melt due to the change in crucible dimensions in accordance with the deformation of a crucible that is heated to high temperatures, the errors in measuring the inner diameter of the crucible, or the like, and thus the level position of the silicon melt surface with respect to that of the heater cannot be maintained at a constant level. For this reason, in order to manufacture a silicon single crystal having a desired defect region by controlling the V/G value, it is necessary to accurately measure the level position of the silicon melt surface while pulling the silicon single crystal, and to accurately control the degree of increase in the crucible level based on this measured value.

As a method for accurately measuring the level position of the silicon melt surface, for example, a method is known in which a laser beam is made to enter at a predetermined angle with respect to the silicon melt and the laser beam reflected at the silicon melt surface is then detected by a detection apparatus. However, the level of silicon melt surface is constantly swaying due to the influence of convection or the like, and thus it has been difficult to accurately measure the level position of the silicon melt surface. For this reason, for example, in Japanese Unexamined Patent Application, First Publication No. Hei 11-147786, a slit is provided in the plane of incidence in a laser beam detector, thereby removing the noise generated due to the swaying of the silicon melt surface.

SUMMARY OF THE INVENTION

However, with the method disclosed in Japanese Unexamined Patent Application, First Publication No. Hei 11-147786, the adverse effect due to the inclination of the silicon melt surface, which is generated close to the boundary between the silicon melt and the outer periphery of a silicon single crystal and is caused by the surface tension, cannot be eliminated. The extent of this adverse effect due to the inclination of the silicon melt surface increases as it approaches the silicon single crystal. Therefore, in those cases where the level position of the silicon melt surface is measured in the vicinity of the silicon single crystal, it may be impossible to make accurate measurements, depending on the conditions when pulling the silicon single crystal, the structure of a single crystal growing apparatus, or the like.

In addition, when the diameter changes while pulling the silicon single crystal upward, the inclination of the silicon melt surface changes due to the surface tension, thereby increasing the extent of errors in the measurements of the level position of the melt surface. Moreover, it is required to provide windows, for making the laser beam to pass through, on both the beam-entering side and the beam-outgoing side, thereby complicating the structure of a single crystal pulling apparatus.

The present invention is made in order to solve the abovementioned problems and its object is to provide a method for manufacturing a silicon single crystal, the method which is capable of accurately controlling the level position of the silicon melt surface and manufacturing a silicon single crystal of high quality having desired crystal characteristics, by accurately detecting the level position of the silicon melt surface while pulling up the single crystal.

In order to solve the above problems, the present invention provides the following method for manufacturing a silicon single crystal.

That is, the method for manufacturing a silicon single crystal according to the present invention is a method for manufacturing a silicon single crystal including a melting step in which a polycrystalline silicon accommodated in a crucible is melted to form a silicon melt in the crucible, and a pulling step in which a silicon single crystal is pulled upward from the silicon melt by the Czochralski method. The method for manufacturing a silicon single crystal according to the present invention is characterized by further including, in the pulling step, a measuring step in which the distance between a melt surface of the silicon melt and a heat shielding member disposed so as to partially cover the melt surface is measured, and a controlling step in which the crystallization temperature gradient (Gc) in the vicinity of a solid-liquid interface within the crystal center of the silicon single crystal and the crystallization temperature gradient (Ge) in the vicinity of a solid-liquid interface within the crystal periphery of the silicon single crystal are controlled, respectively, in accordance with the distance between the melt surface of the silicon melt and the heat shielding member obtained in the measuring step.

In addition, it is preferable that the method further includes, in the pulling step, an imaging step in which an image of a high intensity band appearing in the vicinity of the solid-liquid interface that is present between the silicon melt and the silicon single crystal is taken using an image taking device; a central position identifying step in which image data of the high intensity band undergo a circular approximation or an elliptical approximation to identify the central position thereof; a level position calculating step in which the level position of the silicon melt surface is calculated based on the central position; and a level position adjusting step in which the level position of the silicon melt surface is adjusted by raising the crucible in accordance with the distance between the calculated level position of the silicon melt surface and the heat shielding member.

The aforementioned central position identifying step is preferably a step in which image data of the high intensity band first undergo a simple correction based on the angle formed between the optical axis of the image taking device and the vertical direction, and the high intensity band that is corrected after the simple correction then undergoes a circular approximation to calculate the central position thereof.

The aforementioned level position calculating step is preferably a step in which the level position of the silicon melt surface is calculated by the conversion from the central position of the silicon single crystal to the level position of the silicon melt surface, using a calibration curve showing the relationship between the predetermined central position of the silicon single crystal and the level position of the silicon melt surface.

The aforementioned level position calculating step is preferably a step in which a central position of the silicon single crystal is first identified using one region within the high intensity band, where the meniscus angle satisfies a range which is equal to or greater than 30° and equal to or less than 60°, and the level position of the silicon melt surface is then calculated based on the central position.

The aforementioned level position adjusting step is preferably a step in which relative changes in a level position of the silicon melt surface after the pulling are first detected with reference to a level position of the silicon melt surface which is at a body region of the silicon single crystal at the time point of starting the pulling, and the level position of the silicon melt surface is then adjusted by raising a level of the crucible based on the relative changes in the level position of the silicon melt surface.

According to the method of the present invention for manufacturing a silicon single crystal, even when the silicon single crystal is pulled upward and the amount of silicon melt is reduced, the silicon melt surface is always kept at the same position with respect to the heater. Due to this configuration, the crystallization temperature gradient (Gc) in the vicinity of a solid-liquid interface within the crystal center of the silicon single crystal and the crystallization temperature gradient (Ge) in the vicinity of a solid-liquid interface within the crystal periphery of the silicon single crystal are optimally controlled, respectively.

In addition, by controlling the pulling rate of the silicon single crystal based on the distance between the level position of the silicon melt surface (melt surface) and the heat shielding member, it becomes possible to control the V/G value with high accuracy within a range necessary for achieving a desired defect-free region. As a result, it becomes possible to stably obtain a high quality silicon single crystal containing a defect-free region and in which the diameter of the body region thereof is kept constant at a high yield.

DETAILED DESCRIPTION OF THE INVENTION

A preferred embodiment of the method for manufacturing a silicon single crystal according to the present invention is described below with reference to the attached drawings. Note that the present embodiment is provided for the sake of better understanding of the scope of the present invention through an explanation using one example, and thus the embodiment in no way limits the present invention unless specified otherwise.

Figure 1:
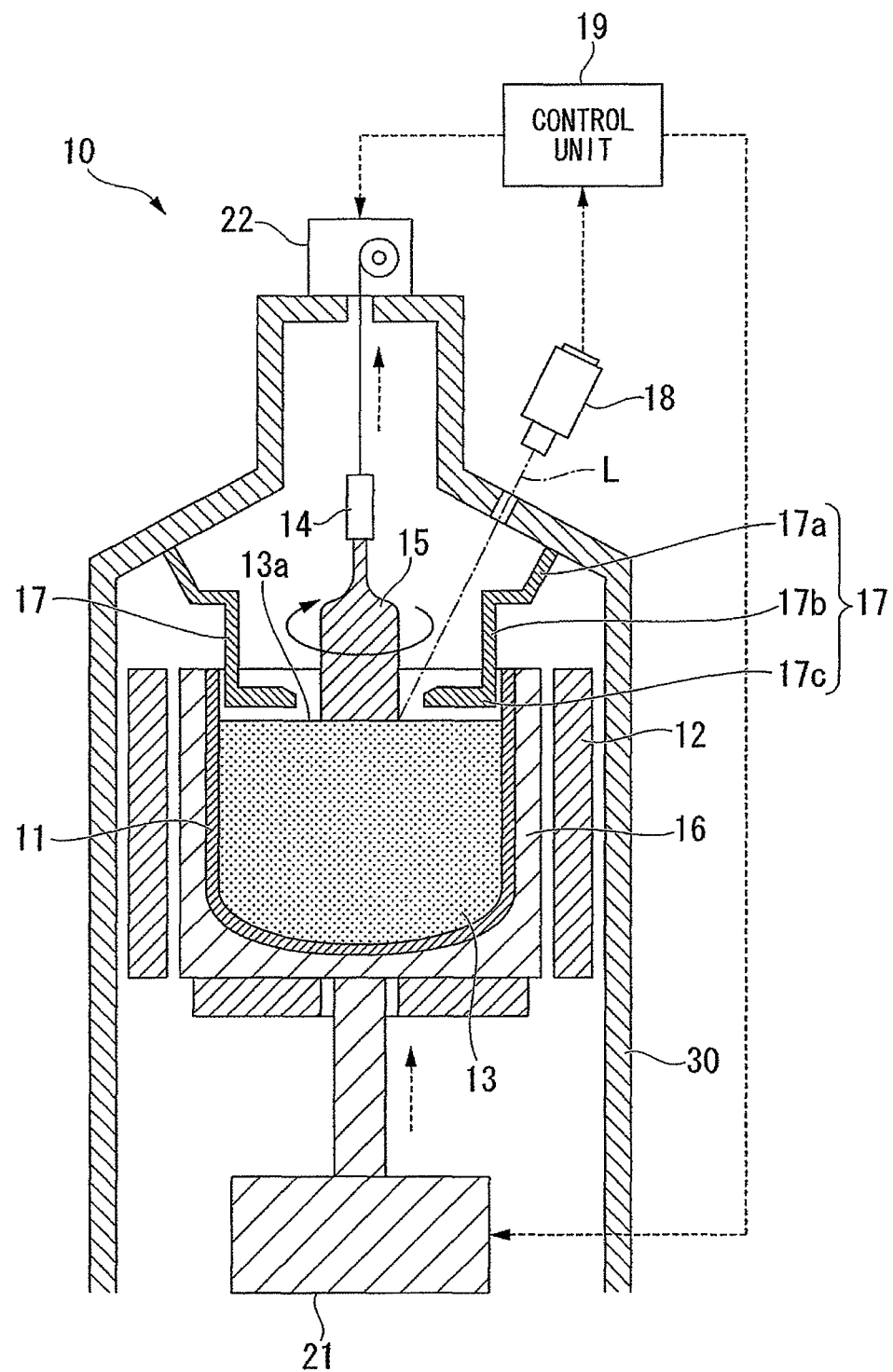
FIG. 1 is a schematic cross sectional view of a silicon single crystal pulling apparatus used in a method for manufacturing a silicon single crystal according to the present invention.
Figure 2:
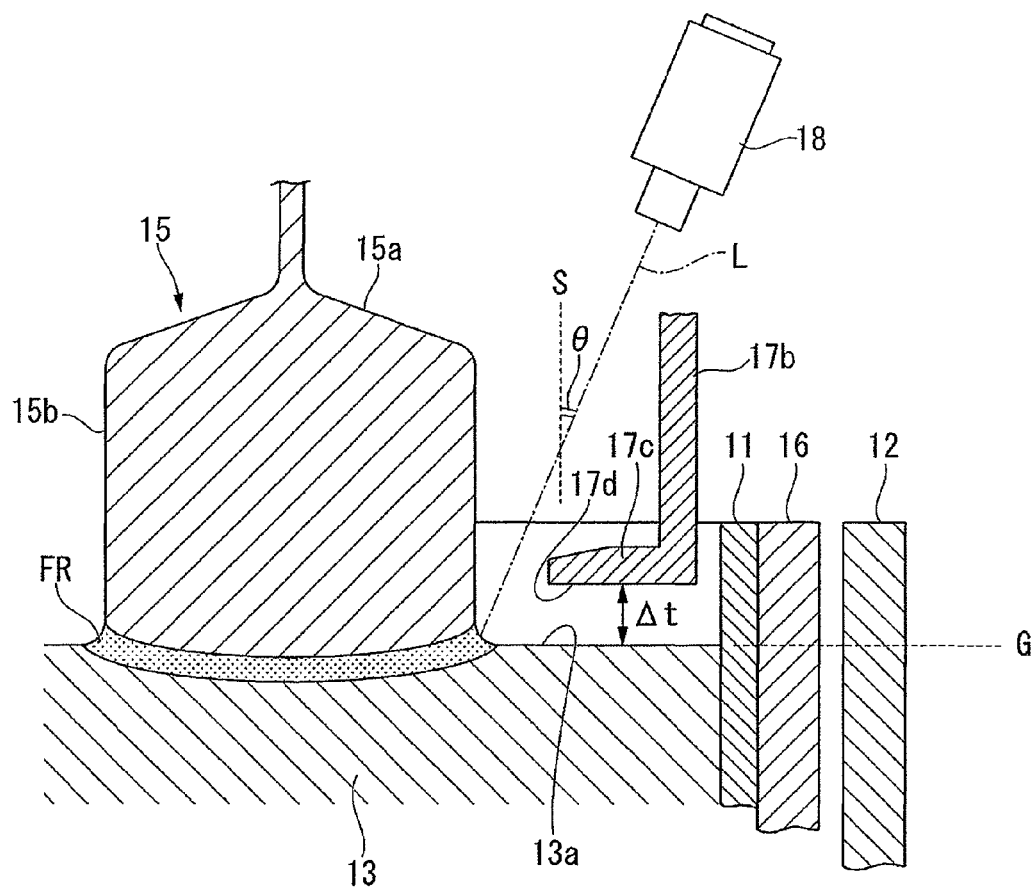
FIG. 2 is an enlarged cross sectional view showing a state of the solid-liquid interface shown in FIG. 1.

FIG. 1 is a schematic cross sectional view of a silicon single crystal pulling apparatus used in a method for manufacturing a silicon single crystal according to the present invention. Below is a description, using FIG. 1, how a silicon single crystal is pulled upward (is grown). FIG. 2 is a cross sectional view by enlarging the vicinity of a solid-liquid interface shown in FIG. 1 between the silicon single crystal and the silicon melt.

A single crystal pulling apparatus 10 includes a crucible 11 made of vitreous silica, a crucible support 16 which supports the crucible 11 and is made of graphite, a heater 12 disposed on the outer side of the crucible support 16, a heat shielding member 17 provided in the upper part of the crucible 11, a crucible position controlling device 21 that rotates and vertically drives the crucible support 16 and the crucible 11, an image taking device 18 that takes images in the vicinity of the solid-liquid interface, a single crystal lifting device 22 that pulls a silicon single crystal upward, and a control unit 19 that controls the crucible position controlling device 21 and the single crystal lifting device 22. In this configuration, the heat shielding member 17 preferably includes an outer graphite shell filled on the inside with a graphite felt. In addition, the heat shielding member 17 includes a cylindrical portion 17b, a flange portion 17a extended continuously from one end of the cylindrical portion 17b, and a circular portion 17c extended continuously from the other end of the cylindrical portion 17b. The flange portion 17a of the heat shielding member 17 is fixed to a shell 30 disposed on the outer side of the heater 12. The thickness of the cylindrical portion 17b is not particularly limited. Accordingly, the shape of the cylindrical portion 17b may be a tubular shape with a uniform thickness or a taper shape in which the inner diameter thereof gradually reduces from the upper end towards the lower end. Further, the circular portion 17c is situated opposite to a melt surface 13a.

When pulling a silicon single crystal upward, polysilicon is loaded in the crucible 11 made of vitreous silica, and the crucible 11 is heated by the heater 12 which is disposed so as to surround the crucible 11 while interposing the crucible support 16 therebetween. Then the polysilicon is melted, thereby forming the silicon melt 13 in the crucible 11 (melting step).

Subsequently, a seed crystal 14 is brought into contact with the silicon melt 13, and a crystal (a silicon single crystal) is then pulled upward while being rotated at a predetermined rotational speed. At this time, after necking down the seed to make the crystal dislocation free, a shoulder portion 15a in which the diameter increases gradually is formed, and the cross section of crystal crown is grown out to a predetermined diameter of the body portion (for example, 300 mm). Subsequently, a body portion (body region) 15b is grown while keeping the diameter thereof at a predetermined level (for example, 300 mm), thereby yielding a silicon single crystal 15 having a predetermined length (for example, 1,800 mm).

When growing the silicon single crystal 15 as described above, in order to control the V/G value with high accuracy so as to yield a desired defect-free region, it is important to conduct the pulling at a constant pulling rate. In the method for pulling a silicon single crystal in the present invention, in order to control the V/G value with high accuracy, the distance $\Delta t$ between the melt surface 13a of the silicon melt 13 and the heat shielding member 17 that is disposed so as to oppose to and to partially cover this melt surface 13a is continuously measured while pulling (growing) the silicon single crystal 15 (measuring step). The distance $\Delta t$ indicates the shortest distance from a face portion 17d of the circular portion 17c that is opposing the melt surface 13a to the melt surface 13a.

In this measuring step, images of the high intensity band (fusion ring) FR generated in the vicinity of the solid-liquid interface between the silicon melt 13 and the silicon single crystal 15 are taken by the image taking device 18, which may be, for example, a CCD camera (imaging step). Then, the image data of high intensity band FR obtained in this imaging step are sent to the control unit 19. In the control unit 19, the image data of high intensity band FR undergo a circular approximation or an elliptical approximation, thereby identifying the central position of the silicon single crystal 15 (central position identifying step).

Figure 3:
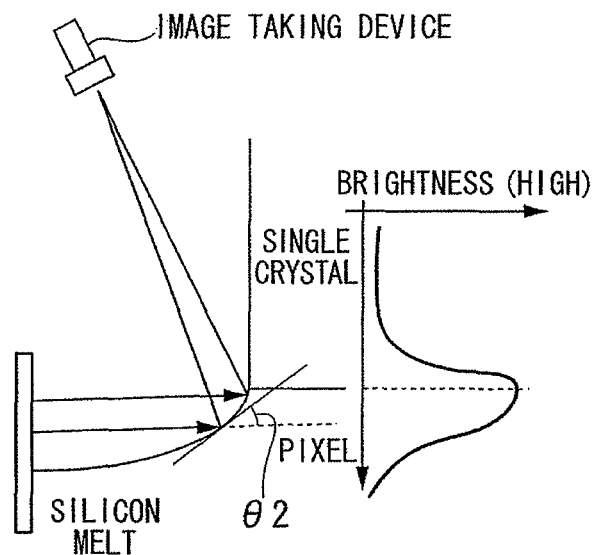
FIG. 3 is a diagram showing the relationship between the brightness distribution of a high intensity band (fusion ring) and the high intensity band.

The brightness distribution of the high intensity band (fusion ring) FR whose images are taken by the image taking device 18 appears, for example, as shown in the graph on the right hand side of FIG. 3. That is, the brightness peak for the high intensity band FR corresponds to the solid-liquid interface of the silicon single crystal 15. In addition, the foot portion in the graph showing the brightness for the high intensity band FR corresponds to the part in which the surface of the silicon melt 13 is inclined due to the surface tension. For this reason, it is possible to detect the position of the solid-liquid interface of the silicon single crystal 15 from the central position of an approximated circle which is calculated using the peak portion of the brightness for the high intensity band FR. On the other hand, when a calculation is made using the data that correspond to the foot portion of the brightness for the high intensity band FR, it is possible to detect the position of the melt surface 13a that continues from the solid-liquid interface.

Figure 4:
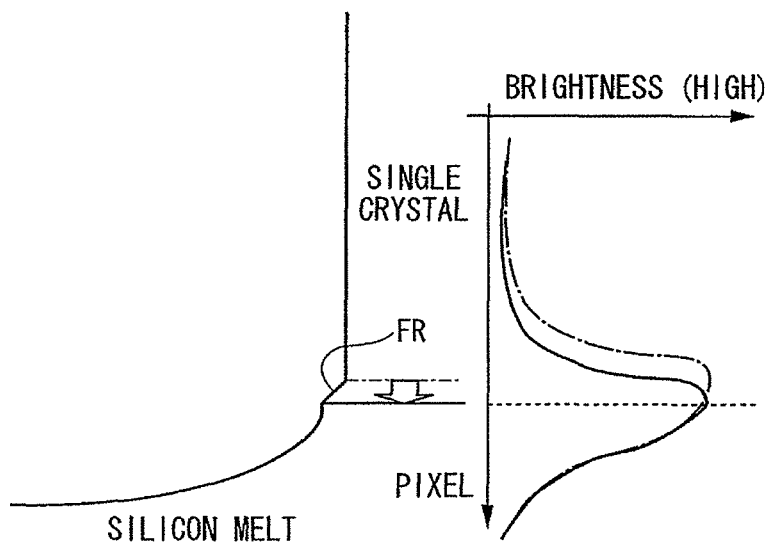
FIG. 4 is another diagram showing the relationship between the brightness distribution of a high intensity band (fusion ring) and the high intensity band.

In addition, when the diameter of the body region 15a changes during the pulling of the silicon single crystal 15, the position of the solid-liquid interface of the silicon single crystal 15 changes. For example, when the diameter of the silicon single crystal 15 starts to increase during the pulling, the position of the solid-liquid interface lowers in response. At this time, with respect to the high intensity band FR, the position of the brightness peak changes as shown in FIG. 4. When the diameter of the silicon single crystal 15 is fluctuating, the position of the solid-liquid interface is reflected in the position of the brightness peak for the high intensity band FR. As a result, the central position of an approximated circle or an approximated ellipse calculated using the measurement results of the brightness for the high intensity band FR reflects the variation in the level of the solid-liquid interface at the time when the diameter of the silicon single crystal 15 is fluctuating.

The image data of the high intensity band FR obtained by the image taking device 18 may be distorted at times because they are image data observed obliquely from above the single crystal pulling apparatus 10.

Therefore, in this central position identifying step, the image data of the high intensity band FR preferably undergo a simple correction based on the angle θ formed between the optical axis L of the image taking device 18 and the vertical direction S. Then, the corrected image data of the high intensity band FR which underwent the simple correction may be subjected to a circular approximation or an elliptical approximation, thereby calculating the central position of the silicon single crystal 15.

The aforementioned simple correction is preferably conducted using the following equations (1) and (2).

$$x'=(x-x_0) \quad (1)$$

$$y'=(y-y_0)/\{(h/v)\cos \theta\} \quad (2)$$

Note that x in the above-mentioned equation (1) indicates a detection position within the image in the transverse direction, $x_0$ indicates ½ of the number of pixels of the picture element used in the transverse direction, and x' indicates the position in the transverse direction after the simple correction. Further, y in the above-mentioned equation (2) indicates a detection position within the image in the longitudinal direction, $y_0$ indicates ½ of the number of pixels of the picture element used in the longitudinal direction, and y' indicates the position in the longitudinal direction after the simple correction.

In addition, although the image taking device 18 used for taking images of the high intensity band FR may be a two-dimensional CCD camera, a one-dimensional CCD camera may also be used as an alternative to a two-dimensional CCD camera. When using a one-dimensional CCD camera, images can be taken by a method in which the one-dimensional CCD camera is mechanically moved in the horizontal direction, a method in which the images of the high intensity band FR are scanned by changing the measuring angle of the one-dimensional CCD camera, or the like. In addition, the image taking device 18 may be configured from 2 or more CCD cameras.

Further, the meniscus portion of the high intensity band FR preferably contains the solid-liquid interface portion of the silicon single crystal 15 as well. It is known that the level of this solid-liquid interface fluctuates as the diameter of the silicon single crystal varies. For this reason, it is preferable to calculate the level position of the silicon melt 13 using one region of the high intensity band FR, which is little affected by the fluctuation of the solid-liquid interface level and in which the meniscus angle (θ2) is preferably within a range equal to or greater than 30° and equal to or less than 60°, more preferably within a range equal to or greater than 40° and equal to or less than 55°.

Based on the data of the central position of the silicon single crystal 15 obtained in this manner, the level position of the silicon melt 13 inside the crucible 11 is calculated (level position calculating step). As an example for this level position calculating step, a calibration curve is made in advance which represents the (corresponding) relationship between the central position of the silicon single crystal 15 and the level position of the silicon melt 13 when the diameter of the silicon single crystal 15 is changed. Subsequently, the value indicating the central position of the silicon single crystal 15 obtained in the central position identifying step is fitted to this calibration curve and is then converted to the level position of the silicon melt, thereby calculating the level position of the silicon melt 13 at the time of measurement (i.e., the current position).

In the control unit 19, the distance Δt between the level position of the silicon melt 13 (i.e., melt surface 13a) and the heat shielding member 17 is calculated. Subsequently, based on this distance Δt value, the crystallization temperature gradient (Gc) in the vicinity of the solid-liquid interface within the crystal center of the silicon single crystal 15 and the crystallization temperature gradient (Ge) in the vicinity of the solid-liquid interface within the crystal periphery of the silicon single crystal 15 are controlled, respectively (controlling step).

In this controlling step, the control unit 19 controls the extent of operation for the crucible position controlling device 21 and the single crystal lifting device 22, based on the distance Δt between the level position of the silicon melt 13 (i.e., melt surface 13a) and the heat shielding member 17 (level position adjusting step). For example, relative changes in the level position of the silicon melt 13 after the pulling are detected with reference to the level position of the silicon melt 13, which is at the body region (body portion) 15b of the silicon single crystal 15 at the time point of starting the pulling. Then, based on the relative changes in the level position of the silicon melt, the level of the crucible 11 is raised by controlling the crucible position controlling device 21.

As a result, even when the silicon single crystal 15 is pulled upward and the amount of silicon melt is reduced, the melt surface 13a of the silicon melt 13 is always kept at the same position with respect to the heater 12. In this manner, the thermal radiation distribution with respect to the silicon melt 13 can always be kept constant. In addition, the crystallization temperature gradient (Gc) in the vicinity of the solid-liquid interface within the crystal center of the silicon single crystal and the crystallization temperature gradient (Ge) in the vicinity of the solid-liquid interface within the crystal periphery of the silicon single crystal are optimally controlled, respectively.

In addition, the control unit 19 controls the single crystal lifting device 22 based on the distance Δt between the level position of the silicon melt 13 (i.e., melt surface 13a) and the heat shielding member 17, thereby controlling the pulling rate of the silicon single crystal 15, as a result of which it becomes possible to control the V/G value with high accuracy within a range necessary for achieving a desired defect-free region. As a result, it becomes possible to stably obtain a high quality silicon single crystal containing a defect-free region and in which the diameter of the body region 15b thereof is kept constant at a high yield.

EXAMPLE 1

Variations in the level position of a silicon melt were examined when a silicon single crystal was pulled upward by the method for manufacturing a silicon single crystal according to the present invention as described above. In addition, as a Comparative Example, variations in the level position of a silicon melt were also examined when the control of the level position of a silicon melt, as in the method according to the present invention, was not conducted. The results are shown in FIG. 5.

Figure 5:
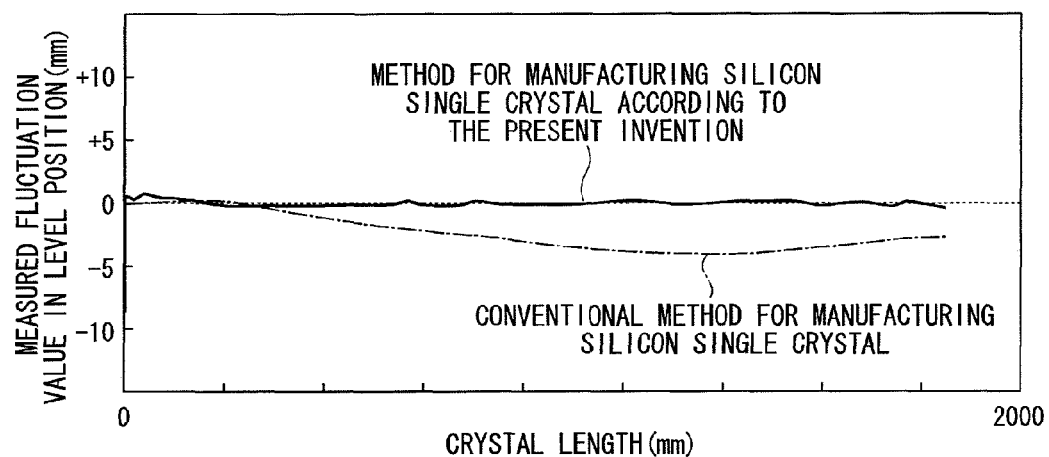
FIG. 5 is a graph showing variations in the level position of the silicon melt surface when pulling a silicon single crystal upward.
Figure 6:
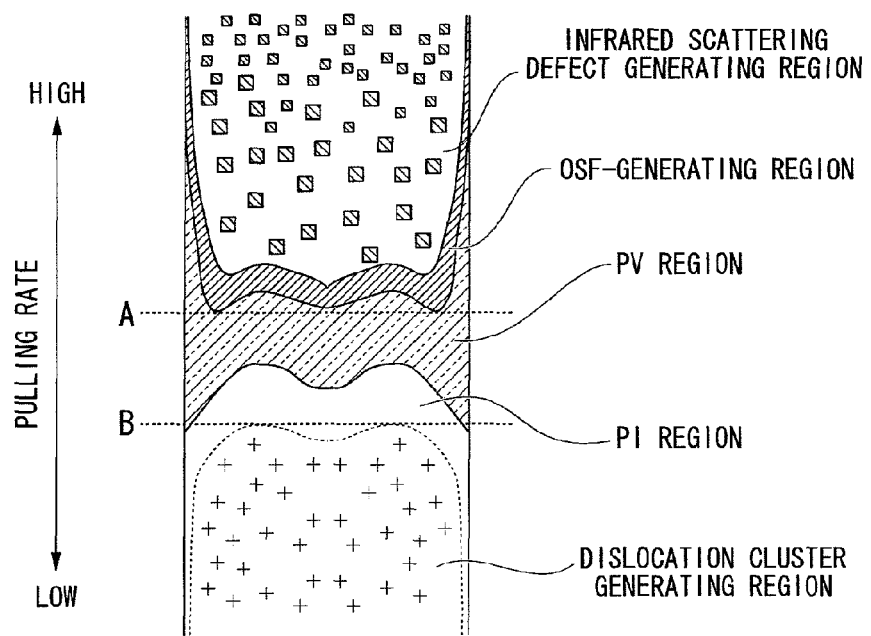
FIG. 6 is a schematic cross sectional view showing a defect distribution state for the silicon single crystal obtained while changing the pulling rate.

From the graph shown in FIG. 5, it is apparent that fluctuations in the level position of the silicon melt were hardly observed with the method for manufacturing a silicon single crystal according to the present invention, and thus a pulling of silicon single crystals having uniform characteristics in a stable manner was possible. On the other hand, with the conventional method for manufacturing a silicon single crystal, the extent of fluctuations in the level position of the silicon melt increased as the length of a silicon single crystal pulled upward increased. Therefore, it was verified that by using the method for manufacturing a silicon single crystal according to the present invention, a high quality silicon single crystal containing a defect-free region can be obtained stably at a high yield.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A method for manufacturing a silicon single crystal comprising:
    a melting step in which a polycrystalline silicon accommodated in a crucible is melted to form a silicon melt in the crucible; and
    a pulling step in which a silicon single crystal is pulled upward from the silicon melt by a Czochralski method,
    wherein the pulling step further includes:
    an imaging step which an image of a high intensity band appearing in the vicinity of the solid-liquid interface that is present between the silicon melt and the silicon single crystal is taken using an image taking device;
    a central position of the silicon single crystal identifying step in which image data of the high intensity band undergo a circular approximation or an elliptical approximation to identify a central position, using one region within the high intensity band, where a meniscus angle satisfies a range which is equal to or greater than 30° and equal to or less than 60°;
    a level position calculating step in which a level position of the silicon melt surface is calculated based on the central position;
    a level position adjusting step in which a level position of the silicon melt surface is adjusted by raising the crucible in accordance with the distance between the calculated level position of the silicon melt surface and the heat shielding member; and
    a controlling step in which a crystallization temperature gradient (Gc) in a vicinity of a solid-liquid interface within a crystal center of the silicon single crystal and a crystallization temperature gradient (Ge) in a vicinity of a solid-liquid interface within a crystal periphery of the silicon single crystal are controlled, respectively.

2. The method for manufacturing a silicon single crystal according to claim 1,
    wherein the central position identifying step is a step in which image data of the high intensity band first undergo a simple correction based on the angle formed between an optical axis of the image taking device and a vertical direction, and
    the high intensity band that is corrected after the simple correction then undergoes a circular approximation to calculate a central position.

3. The method for manufacturing a silicon single crystal according to claim 1,
    wherein the level position calculating step is a step in which the level position of the silicon melt surface is calculated by a conversion from the central position of the silicon single crystal to the level position of the silicon melt surface, using a calibration curve representing a relationship between a predetermined central position of the silicon single crystal and the level position of the silicon melt surface.

4. The method for manufacturing a silicon single crystal according to claim 1,
    wherein the level position adjusting step is a step in which relative changes in a level position of the silicon melt surface after the pulling are first detected with reference to a level position of the silicon melt surface which is at a body region of the silicon single crystal at the time point of starting the pulling, and the level position of the silicon melt surface is then adjusted by raising a level of the crucible based on the relative changes in the level position of the silicon melt surface.

* * * * *